United States Patent
LiKamWa et al.

(10) Patent No.: US 9,503,641 B2
(45) Date of Patent: Nov. 22, 2016

(54) ENERGY-PROPORTIONAL IMAGE SENSOR

(71) Applicant: Microsoft Technology Licensing, LLC, Redmond, WA (US)

(72) Inventors: Robert LiKamWa, Houston, TX (US); Nissanka Arachchige Bodhi Priyantha, Redmond, WA (US); Matthai Philipose, Seattle, WA (US); Lin Zhong, Houston, TX (US); Paramvir Bahl, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 30 days.

(21) Appl. No.: 13/770,031

(22) Filed: Feb. 19, 2013

(65) Prior Publication Data
US 2014/0232932 A1   Aug. 21, 2014

(51) Int. Cl.
H04N 3/14 (2006.01)
H04N 5/335 (2011.01)
H04N 5/232 (2006.01)
H03M 1/00 (2006.01)
H04N 5/341 (2011.01)

(52) U.S. Cl.
CPC ......... *H04N 5/23241* (2013.01); *H03M 1/002* (2013.01); *H04N 5/341* (2013.01)

(58) Field of Classification Search
CPC .............. H04N 5/341; H04N 5/23241; H04N 5/23245; H04N 5/232; H03M 1/002
USPC .................................................. 348/312, 372
See application file for complete search history.

(56) References Cited

U.S. PATENT DOCUMENTS

| 6,838,651 B1 | 1/2005 | Mann |
| 7,038,716 B2 | 5/2006 | Klein et al. |
| 7,230,649 B2 | 6/2007 | Takahashi et al. |
| 7,900,842 B2 | 3/2011 | Silverbrook et al. |

(Continued)

FOREIGN PATENT DOCUMENTS

EP    1474926 A2    11/2004

OTHER PUBLICATIONS

Chen, et al., "Sensorcam: An Energy-Efficient Smart Wireless Camera for Environmental Monitoring", In the Proceedings of the 11th International Conference on Information Processing in Sensor Networks, Apr. 16-20, 2012, 2 pages.

(Continued)

*Primary Examiner* — Antoinette Spinks
(74) *Attorney, Agent, or Firm* — Florin C. Corie; Sandy Swain; Micky Minhas

(57) ABSTRACT

The subject disclosure is directed towards energy saving mechanisms of image sensor circuitry (e.g., in a camera). Image quality data, such as provided by an application, is processed to make energy consumption of image sensor circuitry more proportional to output image quality by controlling the operation of one or more controllable power saving mechanisms of the image sensor circuitry. Power saving mechanisms may include a frequency controlled clock, the ability to turn off unneeded components, an inter-frame standby mode that puts the image sensor circuitry into a standby mode between capturing sequential frames, selectable parallel analog chains having different energy usage properties and column circuitry that allows turning off circuitry corresponding to unneeded columns of the sensor array.

20 Claims, 6 Drawing Sheets

(56) References Cited

U.S. PATENT DOCUMENTS

| | | | |
|---|---|---|---|
| 7,916,897 | B2 | 3/2011 | Corcoran et al. |
| 2003/0107659 | A1* | 6/2003 | Takahashi et al. ........ 348/222.1 |
| 2004/0233324 | A1 | 11/2004 | Galambos et al. |
| 2005/0258991 | A1* | 11/2005 | Efland .................. H03M 1/002 341/144 |
| 2007/0035650 | A1* | 2/2007 | Suzuki .......................... 348/312 |
| 2007/0115459 | A1 | 5/2007 | Nakao et al. |
| 2007/0195192 | A1* | 8/2007 | Miyanari ...................... 348/370 |
| 2010/0053399 | A1* | 3/2010 | Nishi .................... H03M 1/123 348/308 |
| 2010/0302028 | A1 | 12/2010 | Desai et al. |
| 2011/0050945 | A1 | 3/2011 | Konno |
| 2011/0163166 | A1 | 7/2011 | Wang et al. |
| 2014/0192206 | A1* | 7/2014 | Holz ............................. 348/169 |
| 2015/0163403 | A1* | 6/2015 | Wakabayashi ......... H04N 5/378 348/308 |

OTHER PUBLICATIONS

Memon, et al., "Energy Efficient Content Based Image Retrieval in Sensor Networks", In the International Journal of Communications, Network and System Sciences vol. 5, No. 7, Jul. 2012, 11 pages.

Amelifard, et al., "Optimal Selection of Voltage Regulator Modules in a Power Delivery Network", In Proceedings of the 44th Annual Design Automation Conference, Jun. 4-8, 2007, pp. 168-173.

Bahl, et al., "Vision: Cloud-Powered Sight for all: Showing the Cloud What You See", In Proceedings of the Third ACM Workshop on Mobile Cloud Computing and Services, Jun. 25-29, 2012, pp. 53-60.

Chae, et al., "A 2.1 M Pixels, 120 Frame/s CMOS Image Sensor with Column-parallel ADC Architecture", In IEEE Journal of Solid-State Circuits, vol. 46, Issue 1, Jan. 2011, 12 pages.

Cottini, et al., "A CMOS Ultra-Low Power Vision Sensor with Image Compression and Embedded Event-Driven Energy-Management", In Journal on IEEE Emerging and Selected Topics in Circuits and Systems, vol. 1, Issue 3, Sep. 2011, pp. 299-307.

Kawahito, et al., "A CMOS Image Sensor with Analog Two-Dimensional DCT-based Compression Circuits for One-Chip Cameras", In IEEE Journal of Solid-State Circuits, vol. 32, No. 12, Dec. 1997, pp. 2030-2041.

Kim, et al., "A 1-mW CMOS Temporal-Difference AER Sensor for Wireless Sensor Networks", In IEEE Transactions on Electron Devices, vol. 56, Issue 11, Nov. 2009, pp. 2586-2593.

Le, et al., "Analog-to-Digital Converters", In IEEE Signal Processing Magazine, vol. 22, Issue 6, Nov. 2005, 9 pages.

Lenero-Bardallo, et al., "A 3.6 us Latency Asynchronous Frame-Free Event-Driven Dynamic-Vision-Sensor", In Journal of IEEE Solid-State Circuits, vol. 46, Issue 6, Jun. 2011, pp. 1443-1455.

Leon-Salas, et al., "A CMOS Imager with Focal Plane Compression using Predictive Coding", In IEEE Journal of Solid-State Circuits, vol. 42, Issue 11, Nov. 2007, pp. 2555-2572.

Lichtsteiner, et al., "A 128+128 120 dB 15 us Latency Asynchronous Temporal Contrast Vision Sensor", In IEEE Journal of Solid-State Circuits, vol. 43, Issue 2, Feb. 2008, pp. 566-576.

Mallik, et al., "Temporal Change Threshold Detection Imager", In proceedings of IEEE International Solid-State Circuits Conference, Feb. 8, 2005, 3 pages.

Nakamura, Junichi, "Image Sensors and Signal Processing for Digital Still Cameras", Available at: http://ultra.sdk.free.fr/docs/DxO/Image%20Sensors%20and%20Signal%20Processine%20for%20Digital%20Still%20Cameras.pdf, Published on: Aug. 5, 2005, 322 pages.

Oike, et al., "CMOS Image Sensor with Per-column ADC and Programmable Compressed Sensing", In Journal of IEEE Solid-State Circuits, vol. 48, Issue 1, Jan. 2013, pp. 318-328.

Robucci, et al., "Compressive Sensing on a CMOS Separable-Transform Image Sensor" In Proceedings of the IEEE, vol. 98, Issue 6, Jun. 2010, pp. 1089-1101.

Murmann, B., "A/D Converter Trends: Power Dissipation, Scaling and Digitally Assisted Architectures", In Proceedings of IEEE Custom Integrated Circuits Conference, Sep. 21-24, 2008, pp. 105-112.

International Search Report and Written Opinion for PCT/US2014/016336 mailed Aug. 29, 2014, 15 pages.

"Second Written Opinion Issued in PCT Patent Application No. PCT/US2014/016336", Mailed Date: Mar. 4, 2015, 4 Pages.

* cited by examiner

ENERGY-PROPORTIONAL IMAGE SENSOR

BACKGROUND

At times, it is not necessary to capture high-resolution images and/or high frame rate series of images, even when the camera/image sensor may be capable of capturing more many pixels per image and/or per time than needed. For example, some applications only need to have the essence of an image or series of images captured for processing or the like, such as significant features, rather than capture a large number of pixels. One such application is continuous mobile vision, which is generally directed towards capturing and processing a user's visual experience in real-time, on the go.

Contemporary image sensors that are widely-used in mobile systems and personal computers are not energy proportional; that is, when frame rate, resolution and/or number of bits per pixel is lowered, the energy consumption does not proportionally decrease, and indeed, the energy increase per pixel is inversely proportional to the image quality, often significantly. This leads to inefficient operation even when the image sensor is operating with low output image quality. For example, camera applications such as computer vision and augmented reality applications are not able to trade quality for improved battery lifetime.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology in which policy data is matched with variable image quality data to make energy consumption of image sensor circuitry more proportional to output image quality. This includes controlling the operation of one or more controllable power saving mechanisms of the image sensor circuitry. Power saving mechanisms that may be employed based upon the image quality data may include a clock, the ability to turn off unneeded components, an inter-frame standby mode that puts the image sensor circuitry into a standby mode between capturing sequential frames, selectable parallel analog chains having different energy usage properties, and/or column circuitry that allows turning off circuitry corresponding to unneeded columns of the sensor array.

In one aspect, image sensor circuitry includes sensor control logic configured to process an image quality parameter set to save energy consumption by the image sensor circuitry. The control logic controls one or more energy saving mechanisms of the image sensor circuitry based upon the parameter set.

In one aspect, there is described receiving a parameter set comprising one or more image quality related parameters. The parameter set may be used to determine timing for entering image sensor circuitry into a standby mode and waking the image sensor circuitry from the standby mode before a next frame. Upon capturing a frame, the standby mode is entered based upon the timing; the image sensor circuitry is awakened based upon the timing and another frame is captured.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards one or more controllable mechanisms that allow making valuable tradeoffs between energy consumption and output image quality of image sensor circuitry. In this way, the power consumed by the image sensor circuitry is more proportional to the output image quality, (where "proportional" is not necessarily linear).

In one aspect, policy data (e.g., software and/or hardcoded policy data) control the one or more mechanisms to achieve lower energy consumption given a specified output quality for the image sensor. Policy data may be implemented as any set of rules, data tables, logic and so forth that determines how to operate the image sensor components based upon received parameters, generally for the purpose of saving energy/reducing power consumption. Hardware features may be implemented in image sensor circuitry so that energy proportionality may be further improved in a way transparent to programs (e.g., applications) that use the image sensor output.

It should be understood that any of the examples herein are non-limiting. For instance, equations and the like provided herein are only examples, and other equations may provide the same or similar results. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used various ways that provide benefits and advantages in computing and imaging technology in general.

Figure 1:
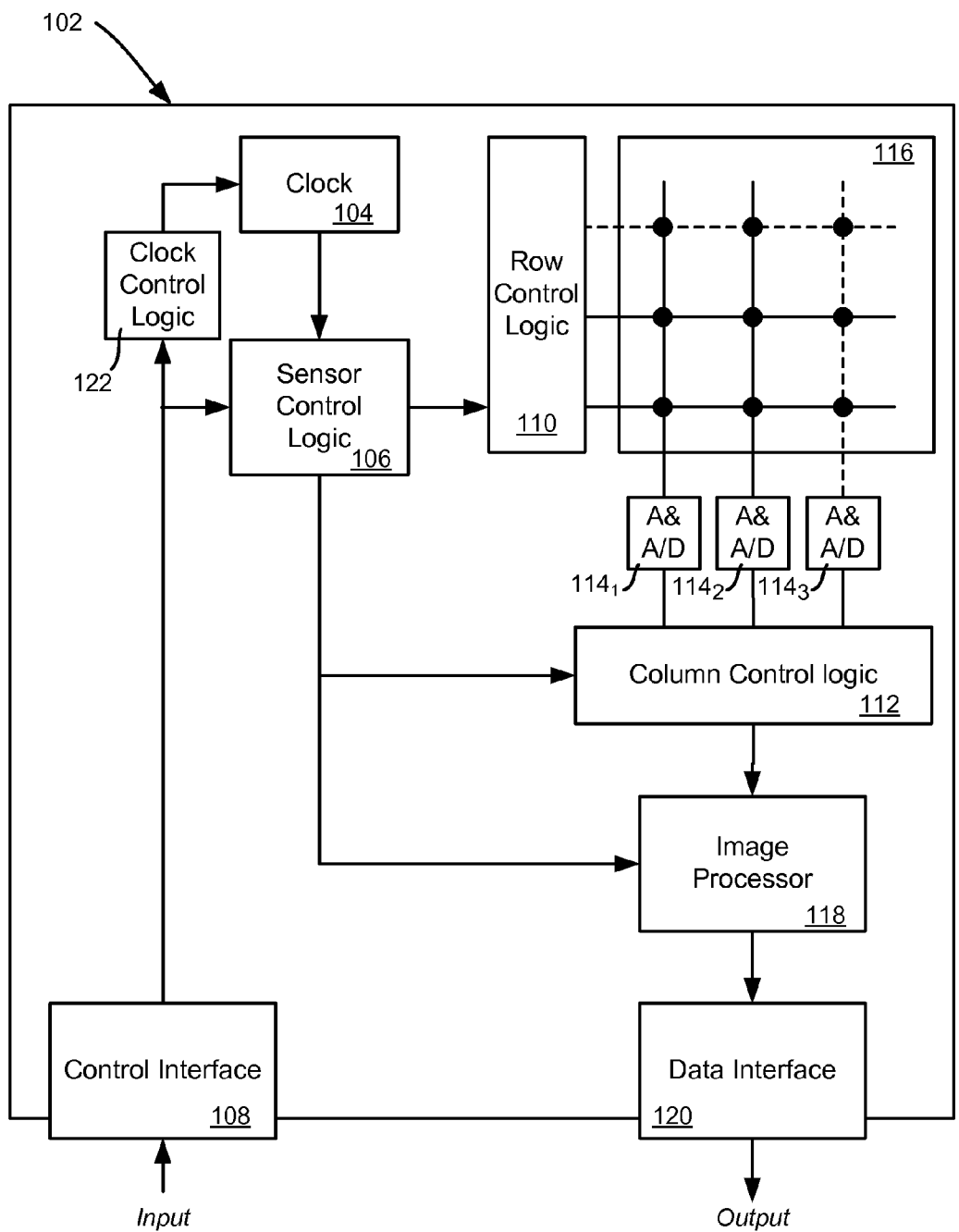
FIG. 1 is a block diagram showing various example components of image sensor circuitry including controllable energy saving components, according to one example embodiment.

FIG. 1 shows an example image sensor circuitry 102 (e.g., in a camera) including a clock 104 and sensor control logic 106, e.g., any one or more sequential state machine, microcontroller and/or computer-readable media. As described herein, programmatic input or the like received at a control interface 108 provides various parameters based upon policy data that control the power consumption of the image sensor circuitry 102. Manual input (e.g., via a button press on the camera) and/or internal programming/logic also may control the power consumption, e.g., if the camera battery is getting low, for example, reduced image quality may be pre-programmed to extend the remaining battery power until the next recharge.

The sensor control logic 106 controls row control logic 110 and column control logic 112 (coupled to amplifier and analog-to-digital converters $114_1$-$114_3$ (only three are shown for purposes of illustration), each of which are coupled to a sensor array 116. The control logic 106 also may control operation of an image processor 118 that outputs the processed data via a data interface 120.

In one aspect, fine-grain clock control may be achieved by controlling a built-in clock or controlling an externally applied clock; (note that FIG. 1 shows the clock as part of the image sensor circuitry 102, and may be considered part of the image sensor circuitry 102 whether internal or external).

The clock 104 represents a master clock and/or pixel clock, which may be adjusted to achieve lower power consumption at a specified frame rate and resolution. Note that in most contemporary devices, the pixel clock derives its frequency from the master clock, however independent control may be provided. Thus, "clock" frequency as described herein refers to the master clock and/or the pixel clock when independent, and also when the pixel clock frequency depends on the master clock frequency by having the pixel clock frequency derived from the master clock frequency.

For example, the components may be driven by an external master clock, which can be set anywhere within a large range of frequencies, such as from six to thirty MHz. The master clock controls the speed of the digital logic of the image processor and the digital controller. In one implementation, the pixel clock, which is driven by the master clock, controls how fast the image sensor reads out pixels; one pixel is read out for each pixel clock period. The pixel clock can be set to be equal to the master clock, or be set such that a pixel clock period is equal to a multiple of the master clock period. Higher speeds allow sensors to process frames at different speeds, but consumes significantly more energy.

The pixel clock, which drives the readout of the pixels from the sensor, may be set to be a fraction of the master clock frequency. The pixel clock division can be set through a sensor register. The pixel clock approximates the power consumption of a master clock, which allows system designers to use the same master clock for the chip, while allowing the lowering the clock speed for exposure purposes.

To determine a more desirable clock frequency with respect to energy consumption, described herein is computing a more optimal clock frequency to reduce power consumption based on parameter(s) including the exposure time, frame rate, and/or the resolution. The following equations may be used for this computation:

Contemporary mobile systems do not change the clock frequency (f) of their image sensors. However, because the clock is supplied externally, changing it may be done via additional hardware, such as a programmable oscillator connected to the external clock input on the image sensor.

Changing the clock frequency has significant implications on the image sensors efficiency, and indeed, measurements show that both $P_{idle}$ and $P_{active}$ (the power consumption of image sensors in idle and active modes, respectively) increase with f almost linearly. The following sets forth relationships between power states and frequency, where $a_1$, $a_2$, $c_1$ and $c_2$ are sensor dependent constants:

$$P_{idle}=a_1 \cdot f+a_2 \quad (1)$$

$$P_{active}=c_1 \cdot f+c_2 \quad (2)$$

$P_{active}$ may be related to the Number of pixels in a frame N as:

$$P_{active}=(b_1 \cdot N+b_2) \cdot f+b_3 \quad (3),$$

where $b_1 \cdot N \cdot f$ denotes the power consumption by the analog signal chain, which reads out N pixels in each cycle of the clock $b_2 \cdot f$ denotes the switching power consumption by the rest of the sensor, driven by the clock. Note that $b_3$ is the same as $c_2$ and denotes the static power consumption of the sensor that is independent of the clocks. Further, $a_1$, $a_2$, and $c_2$ are intrinsic to the sensor and are independent of the frame rate or resolution. In contrast, $c_1$ increases as the number of pixels increases. Still further, $c_1 \gg a_1$ and $c_2 > a_2$ because the digital circuitry usually stops switching in the idle state and the analog circuitry, while not driven by clock, does not do useful work in the idle state.

Turning to single frame capture aspects, the energy for a single frame capture may be represented as:

$$E_{frame}^{single}=P_{idle}T_{exp}+P_{active}T_{active} \quad (4)$$

where $T_{exp}$ is the exposure time and $T_{active}$ is the time in the active state.

$$E_{frame}^{single} = a_1 \cdot T_{exp} \cdot f + \frac{c_2 \cdot N}{f} + C \quad (5)$$

$E_{frame}^{single}$ achieves the minimum when $$f_{best}^{single} = \left(\frac{c_2 \cdot N}{a_1 \cdot T_{exp}}\right)^{\frac{1}{2}}.$$

The frequency choice thus depends on the resolution and the exposure time. For outdoor usage the optimal frequency choice may be higher than the sensor typically allows, and thus for bright outdoors scenes, with short exposure times, the clock frequency should be set as fast as the sensor can handle.

For sequential capture, the power consumption by sequential frame capture, $P_{seq}$, may be represented as:

$$P_{seq} = a_1 \cdot f + \frac{R \cdot N \cdot (c_2 - a_2)}{f} + B \quad (6)$$

$P_{seq}$ reaches its minimum when $$f_{best}^{seq} = \left(\frac{R \cdot N \cdot (c_2 - a_2)}{a_1}\right)^{\frac{1}{2}}.$$

If the frequency is too high, the highest possible frequency may be used. Thus without using the aggressive standby operation (described below), the lowest power consumption for sequential frame capture can be achieved by selecting the clock frequency depending on the frame rate (R) and the frame resolution (N).

As described herein, a desired clock frequency may be programmatically or otherwise selected. For example, a program (application) may provide specified quality data to the driver/firmware in terms of exposure time, frame rate and resolution; the driver/firmware, e.g., represented in FIG. 1 as clock control logic 122, selects the (appropriate) frequencies for the master and pixel clocks. Note that in one implementation, the master clock can be changed with an external programmable clock source, while the pixel clock can be changed by programming a register inside the image sensor. This allows the various constants to be optimized for the specific image sensor circuitry 102. It is also feasible to have the application compute the desired frequency and send data corresponding to the computed frequency, such as if the sensor-dependent constants are known to the application.

Thus, the input to the control interface may be from a program or like that provides data corresponding to the parameters/desired frequency, which may be used to set/control the clock or clocks (master and pixel). Note that the clock only may be capable of running at certain discrete frequencies, and thus the process may include selecting a closest frequency based upon the computations.

In another aspect, generally referred to as "aggressive standby" herein, described is putting virtually the entire image sensor circuitry into a standby mode (which includes any controlled reduced power state or mode) between frames (inter-frame) in sequential frame capturing when a lower frame rate is used for video capturing. This may be implemented in software, such as the firmware and driver of the image sensor. To this end, at a slow enough frame rate, at times nothing else needs to be done in between frames, whereby the driver/firmware may set the control of the power-saving mode logic of the image sensor circuitry so that the image sensor enters the desired power-saving mode at the right time when it is idle, and waked up in time to capture the next frame.

Note that conventional sensors have a standby mode, intended for low power idling, which maintains all register states and allows for rapid wakeup. To resume from the wakeup the sensor needs to undergo a short wakeup period (e.g., on the order of microseconds), after which the capacitors are reset by the shutter and can integrate a frame. This is only feasible when the wakeup time and exposure time added to the time for a single readout is less than the desired frame rate The sensor performs basically no operation during standby mode, so a full $T_{exp}$ cannot pipeline with the readout of the image pixels. As such, the duration of standby mode is $T_{standby} = T_{frame} - T_{exp} - T_{active}$. Therefore, ignoring any of the relatively very small wakeup time aspects, the average power consumption may be calculated as:

$$p_{seq}^{aggr} \approx \frac{P_{standby} \cdot (T_{frame} - T_{active} - T_{exp}) + P_{idle} T_{exp} + P_{active} T_{active}}{T_{frame}} \quad (7)$$

For clarity and simplicity, the standby power may be ignore because it is very small compared to $P_{idle}$ and $P_{active}$ giving:

$$p_{seq}^{aggr} \approx \frac{P_{idle} T_{exp} + P_{active} T_{active}}{T_{frame}} \quad (8)$$

and thus $$p_{seq}^{aggr} \approx a_1 \cdot R \cdot T_{exp} \cdot f + \frac{R \cdot c_2 \cdot N}{f} + D \quad (9)$$

$P_{seq}$ achieves minimum (the optimal clock frequency is) when $$f = f_{best}^{aggr}$$
$$= \left(\frac{c_2 \cdot N}{a_1 \cdot T_{exp}}\right)^{\frac{1}{2}}.$$

With aggressive standby, the sensors optimal clock frequency for sequential frame capture depends on the resolution (N) and exposure time ($T_{exp}$). Again, for bright outdoors scenes with short exposure times, the clock frequency may be set as fast as the sensor can handle. Note that in aggressive standby mode with a fixed clock rate and resolution size, the energy per frame remains constant as frame rate changes. This is due to the fact that frame rate is changed by extending the standby time, where the image sensor circuitry consumes near minimal power. Hence, significant power reductions can result from application of clock-scaling and aggressive standby techniques. Indeed, in one implementation choosing an optimal clock frequency can reduce the power consumption of single frame capture by up to fifty percent; an optimal clock frequency can also reduce the power consumption of sequential frame capture by up to thirty percent. Additionally, by applying standby aggressively between frames, power consumption may be further reduced, e.g., forty percent in one measured implementation.

Turning to another aspect, namely heterogeneous analog signal chains, existing image sensors employ a single analog signal chain. Therefore, the single analog signal chain in such existing image sensors has to be provisioned for the peak performance in terms of pixel per second supported by the image sensor, and is forced to employ a sophisticated design that consumes high energy per pixel. While the pixels per second that are captured can be orders of magnitude lower in practice for continuous applications, the energy per pixel consumed by the analog chain remains almost constant in such devices.

Figure 3:
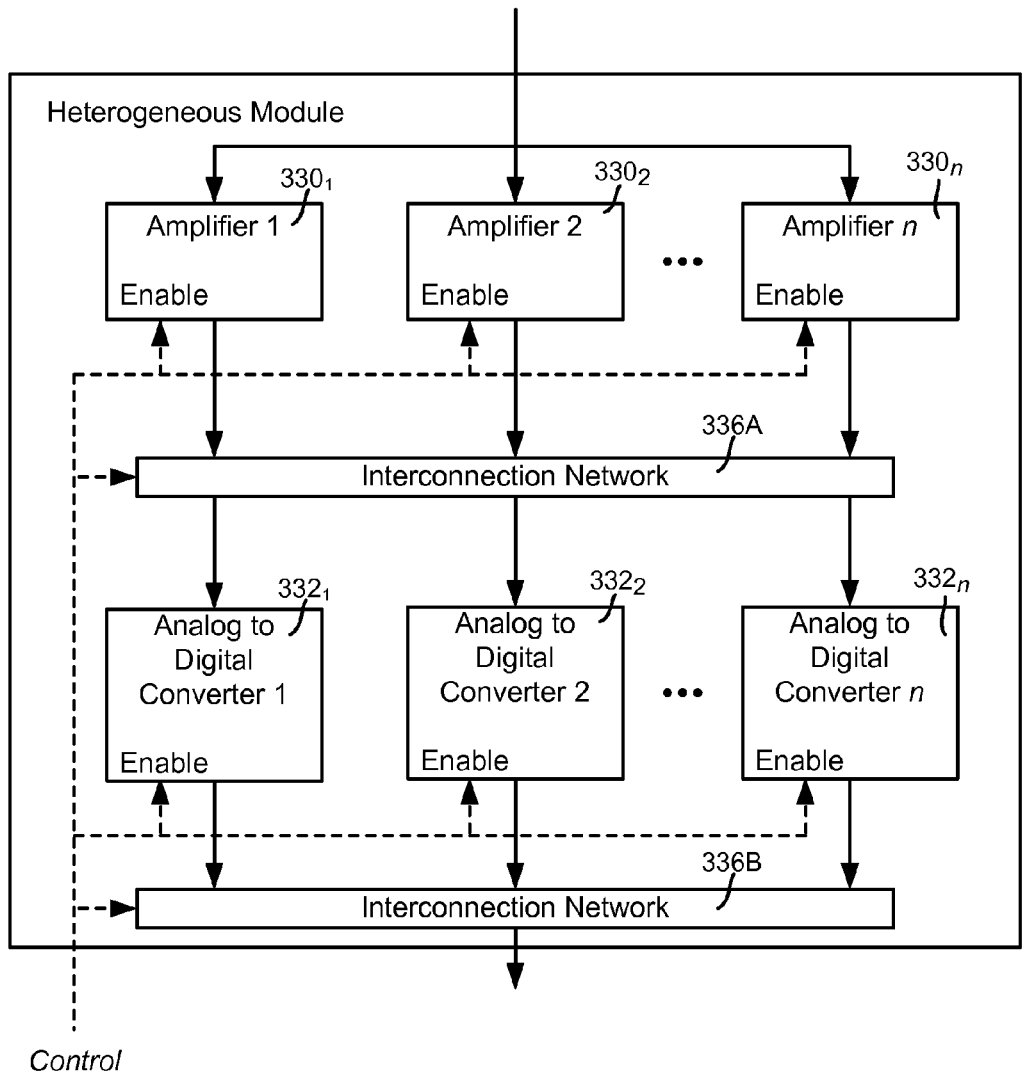
FIG. 3 is a block diagram showing a heterogeneous module that is configured for selection of one of a plurality of analog chains having different energy consumption properties, according to one example embodiment.

Described herein is selectively using a much simpler analog signal chain for low performance capturing, by which much lower energy per pixel consumption can be achieved. To this end, FIG. 3 shows an image sensor that includes a heterogeneous collection of analog signal chains, each optimized for operating for a certain performance. For example, one sophisticated chain $330_1$ and $332_1$ may be active for full resolution, e.g., high-quality video taking, while another analog signal chains $330_2$ and $332_2$ may be used when a lower resolution is needed, such as for computer vision applications. In both cases, the idle chain is not enable, which includes being powered off or substantially powered off. While these additional heterogeneous analog signal chains use more transistors and slightly complicate system designs, they have the opportunity to reduce the energy per pixel when lower frame rate and resolution are adequate.

FIG. 3 shows one example that provides the ability to reduce energy/power by using heterogeneous hardware components such as analog-to-digital converters with different resolutions and/or amplifiers with different signal quality. Note that a selected chain of a heterogeneous module may be implemented in any of the amplifier and analog-to-digital converter blocks shown in FIGS. 1 and 2.

To select a chain that most closely matches the desired quality, the controller (e.g., the sensor control logic 106, FIG. 1) enables or disables each component according to the quality parameters received from the application. In other words, when the image sensor circuitry receives the specified frame rate and resolution, the internal controller sets set the schedule of each component in the module properly, i.e., which are selected for operation and which are powered off. Further, via control of interconnection networks 336A and 336B, the controller connects the chains. As can be seen, FIG. 3 shows selectable multi-resolution/multi-power analog-to-digital converters controllers and amplifiers, and schematically shows that they can be controlled to achieve a given quality/resolution profile by turning on only the appropriate sub-modules. Any practical number of parallel chains may be available (as shown via blocks $330_1$-$330_n$, e.g., one provisioned for peak performance, another provisioned for the lowest performance, with zero or more selectable chains between the highest and lowest performance levels.

It should be noted that while parallel chains of analog to digital converters may be used as shown in FIG. 3, other ways of saving power with analog-to-digital converters may be used. For example, some analog to digital converters are designed to have variable characteristics such as rate that can be controlled. Thus, as used herein, "parallel chain" refers to an actual parallel chain or a "virtual" parallel chain in which lower power is achieved by selecting a different path or changing the power consumption characteristics of an analog-to-digital converters on a path, respectively.

Another power saving mechanism described herein is based upon fine-grained power management that operates by gating the power supply or clock to reduce the power consumption during the active state. To this end, existing image sensors employ column-parallel analog signal chains in which there is an individual sub-chain for each column of the pixel arrays. During readout, all sub-chains operate in parallel to read out a row of pixels simultaneously. However, during column skipping and windowing operations that reduce resolution, not all pixels of a row need to be read out. The analog signal sub-chains for the skipped columns are left on in modern image sensors, with the data collected thereby discarded. Thus, while conventional binning, skipping, and windowing reduce the number of pixels that need to be read out, these techniques do not significantly lower the readout power consumption of the image sensor.

Described herein is shutting down components that are not needed when fewer pixels are addressed, to save power. For example, if the desired resolution is such that only half of the columns (e.g., alternating ones) are addressed, shutting down the other half lead to substantial power savings, dropping the analog power by half and the total power by thirty to forty percent.

Figure 4:
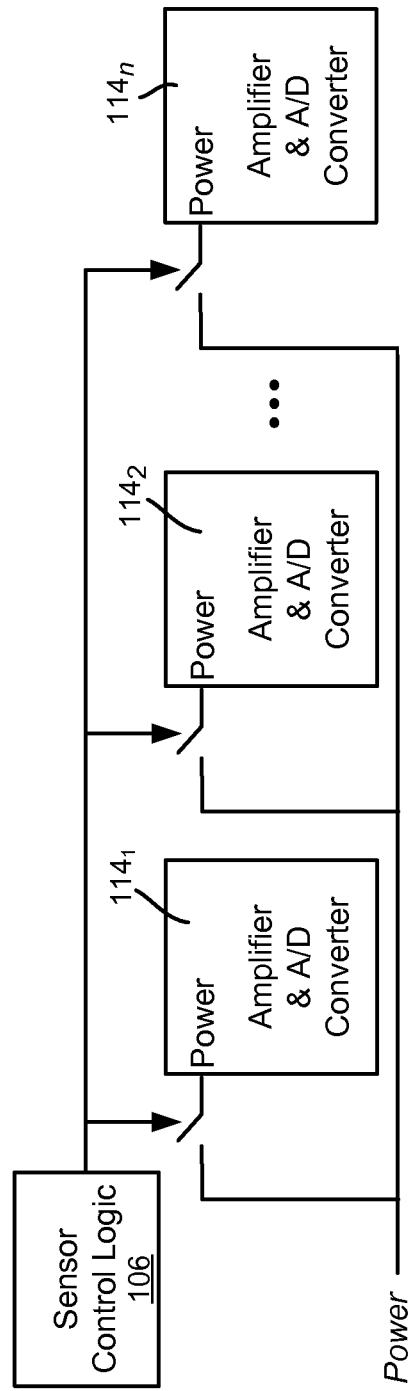
FIG. 4 is a representation of how column circuitry may be selectively powered per column, according to one example embodiment.

FIG. 4 shows how electronics in unused columns (e.g., during windowing and column skipping) can be selectively turned off to save power. The control logic 106 determines from the received parameters which of the column circuitry represented by blocks $114_1$-$114_n$ may be turned off, which may be done directly of via the column control logic 112 (FIG. 1). By turning off the power (power-gating) of the per-column readout circuitry (e.g., amplifier and analog-to-digital converter) when the corresponding column is skipped for sub-sampling for a lower resolution frame, significant power savings may be achieved. Note that if circuitry allows selectively turning off the columns (or rows) of the sensor array 116 (FIG. 1) that are not needed, then this may be done to further save power.

Figure 2:
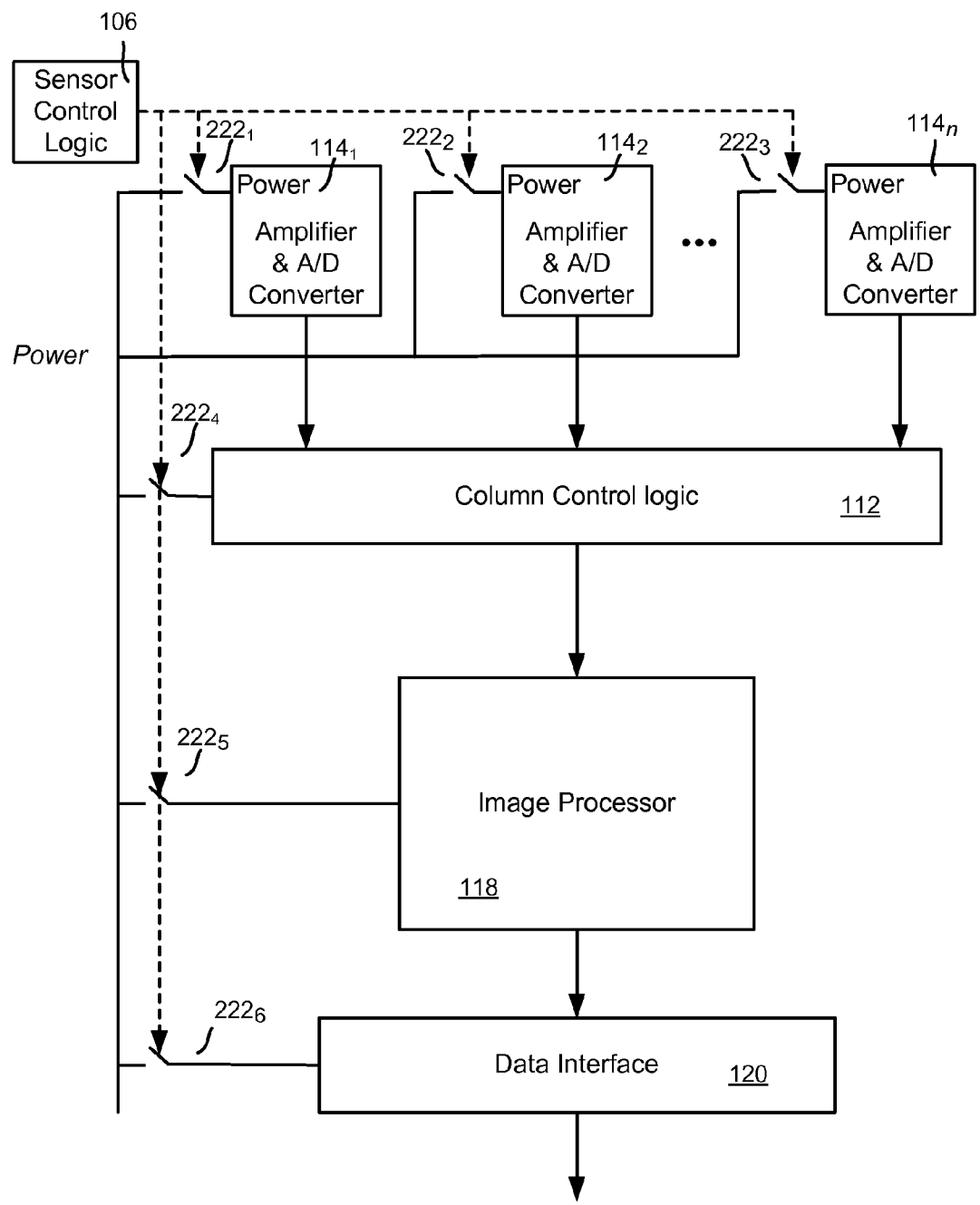
FIG. 2 is a block diagram showing how various example components of image sensor circuitry may be power controlled, according to one example embodiment.

Turning to another aspect, described herein is controlling the energy consumption of various idle components of the image sensor circuitry by putting the idle components into power-saving modes during image capturing. For example, any component that is not active at the capturing state (at least for part of the time) may be turned off by adding power gating circuitry to such a component; the component may be turned back on with very short latency. The power on/off control can either be set through registers that are written in software via the control interface and/or by the digital controller inside the image sensor, e.g., in which the sensor control logic may be programmed. FIG. 2 shows adding such power gating, represented by example elements $222_1$-$222_6$, (although there may be more or less in a given configuration) to example modules 112-120 to enter idle components into power-saving modes to reduce the overall power consumption.

More particularly, for single frame capture and sequential frame capture with aggressive standby applied, the power consumption during exposure time can contribute significantly to the total energy per frame or average power consumption, respectively. During the exposure time ($T_{exp}$), which can be long (e.g., fifty ms) under low illumination, most parts, including the digital components, the analog signal chain's amplifiers and analog-to-digital converters, and the I/O, are in idle state, which still consumes substantial power. By putting these parts into a standby mode with power or clock gated, the sensor reduces the energy consumption of taking a single frame, (described in equations (4) and (5)), and the power consumption of sequential capture, (described in equation (6). When the power management is applied to the exposure time, the best clock frequency is always the highest possible regardless of the exposure time. At this point, for long exposures, the sensor can consume fractions of the original energy cost of single frame capture.

Figure 5:
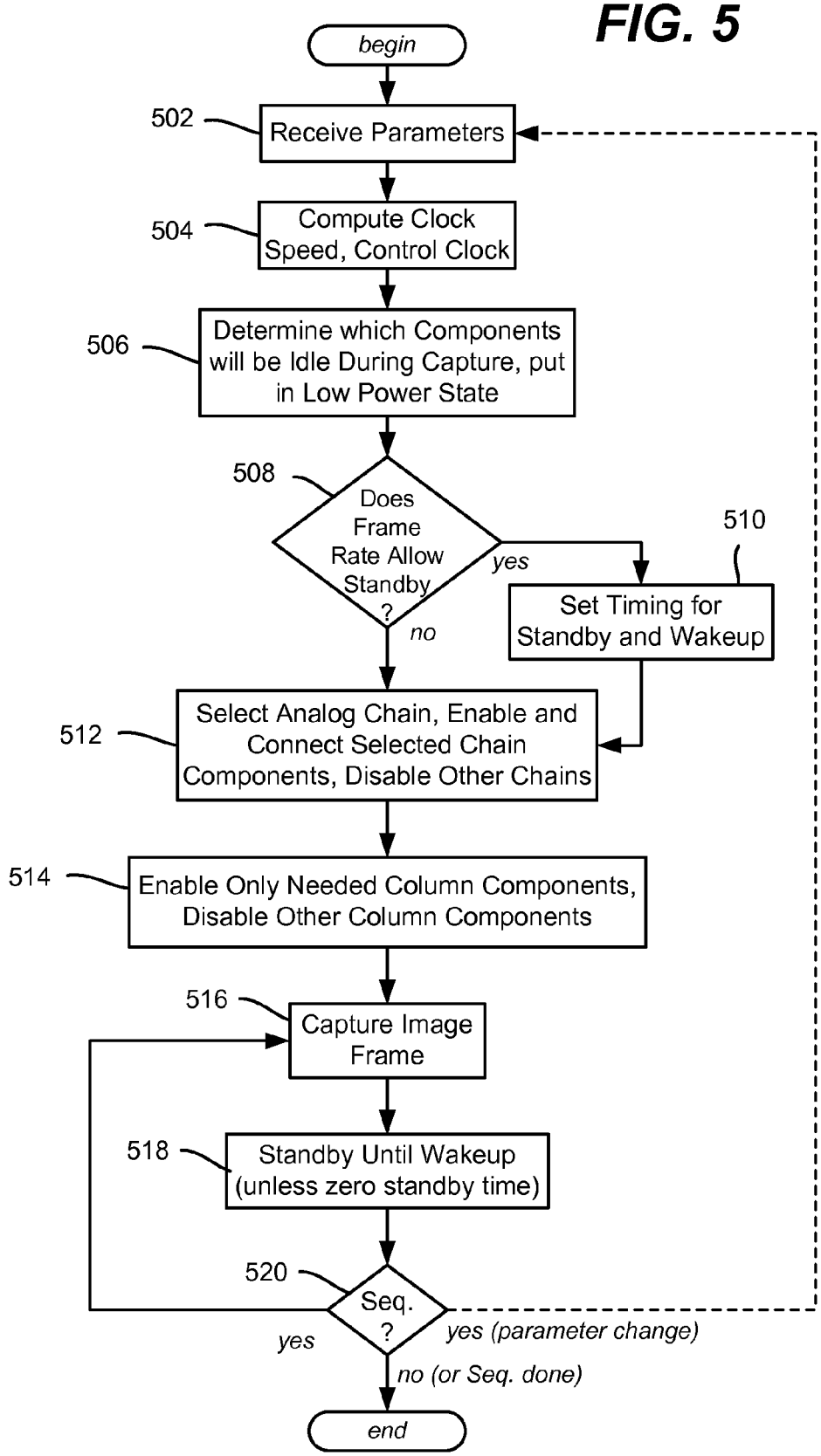
FIG. 5 is a flow diagram showing example steps that may be taken to make image sensor circuitry more energy proportional to image quality, according to one example embodiment.

FIG. 5 is a flow diagram showing example steps that may be taken to reduce power consumption in image sensor circuitry to provide a more energy proportional image sensor. As can be readily appreciated, many of the steps of FIG. 5 are not order-dependent, and not all of the steps need be performed to provide power savings.

Step 502 represents receiving the specified parameters such as including the exposure time, frame rate, and/or the resolution. Step 504 computes the clock speed based upon the parameters, and sets the clock accordingly. Step 506 determines whether any components will be idle during the capturing process, and if so, enters those components into a low (or lower) power state; (note that this is not intended to represent entering aggressive standby after the image is captured/processed.

Step 508 represents determining based upon the frame rate (assuming the capture is sequential) whether (most of) the image sensor circuitry may be put into a standby (or other reduced power mode) between frames. If so, step 510 determines the timing for entering the standby mode and the time for waking to capture the next frame.

Step 512 represents selecting the analog chain components to enable based upon the performance needed, as described above. These components may be enabled, with others disabled (if not already disabled), and interconnected. Step 514 turns off any analog modules for columns where data capture is not needed.

Step 516 represents capturing the image frame for the active time. Step 518 then enters the standby mode (if a non-zero standby time was determined) until the wakeup time. If not a single frame capture, step 520 repeats the frame rate capture and any standby/wakeup process for sequential frame capture, until sequential capturing is done. Note that the parameters may change between frames during sequential image capture, and thus as indicated by the dashed arrow, step 520 may instead branch to step 502 and rerun any of the steps described above based upon the new parameters.

As can be seen, various power saving mechanisms may be provided in image sensory circuitry. Note that while the above examples are directed towards selectable and controllable components within a single image capturing "pipe" or the like, it is also feasible to have multiple image pipes, with (at least some) of the components replicated for each pipe with different quality/energy consumption properties. Selection of such a pipe based upon energy savings is thus another energy saving mechanism that may be implemented in image sensor circuitry.

EXAMPLE OPERATING ENVIRONMENT

As mentioned, advantageously, the techniques described herein can be applied to any device, such as to provide parameters to the image sensing circuitry. It can be understood, therefore, that handheld, portable and other computing devices and computing objects of all kinds including multi-component configurations (that include a display component for example) are contemplated for use in connection with the various embodiments. Accordingly, the below general purpose remote computer described below in FIG. 6 is but one example of a computing device.

Embodiments can partly be implemented via an operating system, for use by a developer of services for a device or object, and/or included within application software that operates to perform one or more functional aspects of the various embodiments described herein. Software may be described in the general context of computer executable instructions, such as program modules, being executed by one or more computers, such as client workstations, servers or other devices. Those skilled in the art will appreciate that computer systems have a variety of configurations and protocols that can be used to communicate data, and thus, no particular configuration or protocol is considered limiting.

Figure 6:
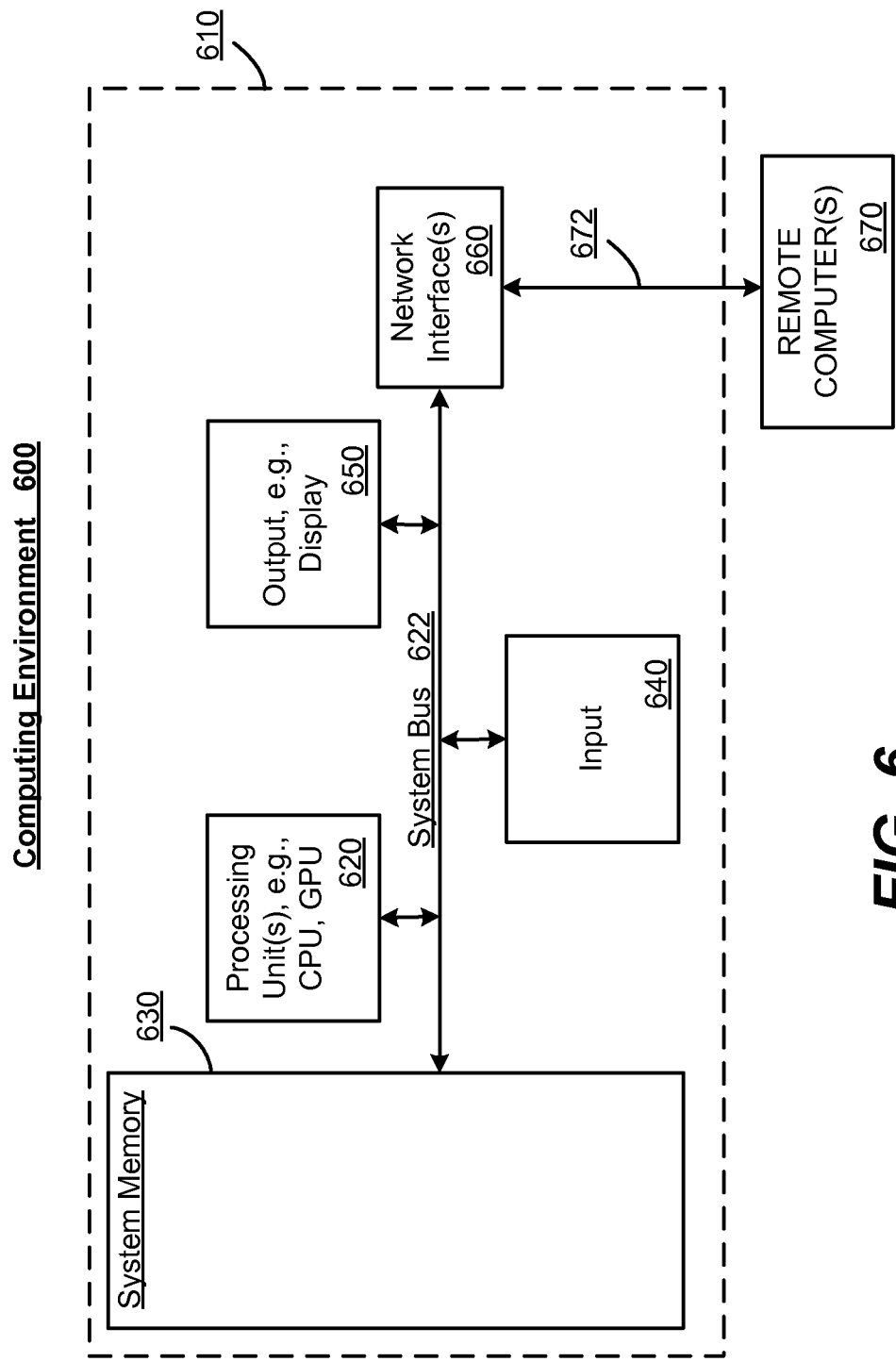
FIG. 6 is a block diagram representing an example computing environment into which aspects of the subject matter described herein may be incorporated.

FIG. 6 thus illustrates an example of a suitable computing system environment 600 in which one or aspects of the embodiments described herein can be implemented, although as made clear above, the computing system environment 600 is only one example of a suitable computing environment and is not intended to suggest any limitation as to scope of use or functionality. In addition, the computing system environment 600 is not intended to be interpreted as having any dependency relating to any one or combination of components illustrated in the example computing system environment 600.

With reference to FIG. 6, an example remote device for implementing one or more embodiments includes a general purpose computing device in the form of a computer 610. Components of computer 610 may include, but are not limited to, a processing unit 620, a system memory 630, and a system bus 622 that couples various system components including the system memory to the processing unit 620.

Computer 610 typically includes a variety of computer-readable media and can be any available media that can be accessed by computer 610. The system memory 630 may include computer storage media in the form of volatile and/or nonvolatile memory such as read only memory (ROM) and/or random access memory (RAM). By way of example, and not limitation, system memory 630 may also include an operating system, application programs, other program modules, and program data.

A user can enter commands and information into the computer 610 through input devices 640. A monitor or other type of display device is also connected to the system bus 622 via an interface, such as output interface 650. In addition to a monitor, computers can also include other peripheral output devices such as speakers and a printer, which may be connected through output interface 650.

The computer 610 may operate in a networked or distributed environment using logical connections to one or more other remote computers, such as remote computer 670. The remote computer 670 may be a personal computer, a server, a router, a network PC, a peer device or other common network node, or any other remote media consumption or transmission device, and may include any or all of the elements described above relative to the computer 610. The logical connections depicted in FIG. 6 include a network 672, such local area network (LAN) or a wide area network (WAN), but may also include other networks/buses. Such networking environments are commonplace in homes, offices, enterprise-wide computer networks, intranets and the Internet.

As mentioned above, while example embodiments have been described in connection with various computing devices and network architectures, the underlying concepts may be applied to any network system and any computing device or system in which it is desirable to improve efficiency of resource usage.

Also, there are multiple ways to implement the same or similar functionality, e.g., an appropriate API, tool kit, driver code, operating system, control, standalone or downloadable software object, etc. which enables applications and services to take advantage of the techniques provided herein. Thus, embodiments herein are contemplated from the standpoint of an API (or other software object), as well as from a software or hardware object that implements one or more embodiments as described herein. Thus, various embodiments described herein can have aspects that are wholly in hardware, partly in hardware and partly in software, as well as in software.

The word "example" is used herein to mean serving as an example, instance, or illustration. For the avoidance of doubt, the subject matter disclosed herein is not limited by such examples. In addition, any aspect or design described herein as "example" is not necessarily to be construed as preferred or advantageous over other aspects or designs, nor is it meant to preclude equivalent example structures and techniques known to those of ordinary skill in the art. Furthermore, to the extent that the terms "includes," "has," "contains," and other similar words are used, for the avoidance of doubt, such terms are intended to be inclusive in a manner similar to the term "comprising" as an open transition word without precluding any additional or other elements when employed in a claim.

As mentioned, the various techniques described herein may be implemented in connection with hardware or software or, where appropriate, with a combination of both. As used herein, the terms "component," "module," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it can be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In view of the example systems described herein, methodologies that may be implemented in accordance with the described subject matter can also be appreciated with reference to the flowcharts of the various figures. While for purposes of simplicity of explanation, the methodologies are shown and described as a series of blocks, it is to be understood and appreciated that the various embodiments are not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, some illustrated blocks are optional in implementing the methodologies described hereinafter.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A method for controlling an operation of one or more controllable power saving mechanisms of image sensor circuitry, the method comprising:
    receiving image quality parameters comprising a frame rate; and
    placing an analog-to-digital converter into standby mode between sequential frame capture based on the frame rate.

2. The method of claim 1 wherein the one or more power controllable power saving mechanisms of the image sensor circuitry comprise at least one clock having a controllable frequency, and wherein controlling the operation of the one or more power saving mechanisms comprises adjusting the controllable frequency of the at least one clock to make the energy consumption of the image sensor circuitry more proportional to output image quality.

3. The method of claim 2 wherein determining the frequency comprises matching the policy data based upon an exposure time, a frame rate, or a resolution, or any combination of an exposure time, a frame rate, or a resolution.

4. The method of claim 1 wherein the one or more power controllable power saving mechanisms of the image sensor circuitry comprise control logic that determines a set of one or more components that are not needed to capture image data based upon the parameters, and wherein controlling the operation of one or more controllable power saving mechanisms comprises putting at least one of the components of the set into a reduced power mode.

5. The method of claim 1 wherein the sequential frame capture is specified corresponding to the frame rate, wherein the one or more controllable power saving mechanisms of the image sensor circuitry comprises control logic that determines, based upon the frame rate, whether the image sensor circuitry is able to enter a standby mode between capturing frames, and if so, wherein controlling the operation of one or more controllable power saving mechanisms comprises putting at least some of the image sensor circuitry into a standby mode between at least some of the captured frames.

6. The method of claim 5 further comprising
    determining a wakeup time based upon the frame rate; and
    waking up the image sensor circuitry from the standby mode in time to capture a next frame at the same frame rate.

7. The method of claim 1 wherein the one or more controllable power saving mechanisms of the image sensor circuitry comprise parallel analog chains, each chain having different energy usage properties, and wherein controlling the operation of the one or more controllable power saving mechanisms comprises enabling one of the parallel analog chains and disabling any other parallel analog chain based upon the matching of the policy data with the variable image quality data.

8. The method of claim 1 wherein the one or more controllable power saving mechanisms of the image sensor circuitry comprise control logic that turns off column circuitry corresponding to columns of the sensor array, and wherein controlling the operation of the one or more controllable power saving mechanisms comprises determining which columns of data are not needed based upon the parameters, and turning off column circuitry for at least some of the columns that are not needed.

9. A system comprising:
    image sensor circuitry having sensor control logic configured to process an image quality parameter set to save energy consumption by controlling one or more energy saving mechanisms of the image sensor circuitry based upon the image quality parameter set, wherein controlling one or more energy saving mechanisms of the image sensor circuitry based upon the image quality parameter set comprises placing an analog-to-digital converter into standby mode between sequential image capture based on the image quality parameter set and waking up the analog-to-digital converter from standby mode during an image capture.

10. The system of claim 9 wherein the image sensor circuitry is incorporated into a camera, and where the parameter set comprises at least one of a frame rate-based parameter, a resolution-based parameter, or an exposure time-based parameter.

11. The system of claim 9 wherein the image sensor circuitry is coupled to an interface for programmatic specification of the image quality parameter set, wherein operation of the image sensor circuitry based on the image quality parameter set is determined by a set of rules.

12. The system of claim 11 further comprising a continuous mobile vision application configured to provide the image quality parameter set to the image sensor circuitry via the interface.

13. The system of claim 9 wherein one of the energy saving mechanisms comprises at least one frequency-adjustable internal or external clock coupled to the control logic, the control logic configured to adjust clock frequency to save energy.

14. The system of claim 9 wherein one or more energy saving mechanisms comprises one or more components that based upon the parameter set are not needed during an image capture operation, and wherein the control logic is configured to disable at least one of the of the one or more components that are not needed.

15. The system of claim 9 wherein the sequential image capture is specified corresponding to a frame rate based parameter of the image quality parameter set, wherein the one or more energy saving mechanisms of the image sensor circuitry comprises an inter-frame standby mode, and wherein the control logic enters virtually all of the sensor circuitry into the standby mode between frames at the same frame rate.

16. The system of claim 9 wherein the control logic is configured to wake up the image sensor circuitry from the standby mode in time to capture a next frame.

17. The system of claim 9 wherein the one or more energy saving mechanisms of the image sensor circuitry comprise parallel analog chains, each chain having different energy usage properties, and wherein the control logic is configured to enable one of the parallel analog chains and disable any other parallel analog chain based upon the parameter set.

18. The system of claim 9 wherein the one or more energy saving mechanisms of the image sensor circuitry comprise column circuitry corresponding to columns of the sensor array that is configured to be selectively turned on or off, and wherein the control logic is configured to determine which columns of data are not needed based upon the parameter set, and turn off the column circuitry for at least some of the columns that are not needed.

19. One or more computer-readable storage media having computer-executable instructions that cause one or more processors to perform operations comprising:
receiving a parameter set comprising one or more image quality related parameters;
turning off an analog-to-digital converter that is not needed for capturing an image according to the parameter set;
determining timing for entering a set of image sensor circuitry into a standby mode and waking the set of image sensor circuitry from the standby mode before a next frame based upon the parameter set;
capturing a frame;
upon capturing the frame, placing the set of image sensor circuitry into the standby mode based upon the determined timing;
waking the set of image sensor circuitry based upon the determined timing; and
upon waking the set of image sensor circuitry, capturing another frame.

20. The one or more computer-readable storage media of claim 19 having further computer-executable instructions, that further cause the one or more processors to perform an operation comprising turning on the analog-to-digital converter after the frame is captured without a change in the parameter set.

* * * * *